United States Patent
Han et al.

(10) Patent No.: US 11,387,302 B2
(45) Date of Patent: Jul. 12, 2022

(54) DISPLAY DEVICE AND METHOD OF MANUFACTURING DISPLAY DEVICE

(71) Applicant: SAMSUNG DISPLAY CO., LTD., Yongin-si (KR)

(72) Inventors: Jaebum Han, Yongin-si (KR); Younggil Park, Yongin-si (KR); Junghwa Park, Yongin-si (KR); Nari Ahn, Yongin-si (KR); Sooim Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/837,652

(22) Filed: Apr. 1, 2020

(65) Prior Publication Data
US 2021/0066424 A1    Mar. 4, 2021

(30) Foreign Application Priority Data
Sep. 3, 2019    (KR) .................. 10-2019-0108938

(51) Int. Cl.
*H01L 27/32* (2006.01)
*H01L 51/56* (2006.01)
*H01L 51/00* (2006.01)

(52) U.S. Cl.
CPC ...... *H01L 27/3258* (2013.01); *H01L 51/0094* (2013.01); *H01L 51/56* (2013.01); *H01L 2227/323* (2013.01); *H01L 2251/5376* (2013.01)

(58) Field of Classification Search
CPC . H01L 27/3258; H01L 51/0094; H01L 51/56; H01L 2227/323; H01L 2251/5376

USPC .......................................................... 257/79
See application file for complete search history.

(56) References Cited

U.S. PATENT DOCUMENTS

| | | | |
|---|---|---|---|
| 9,252,285 B2 | 2/2016 | Seo et al. | |
| 9,991,389 B2 | 6/2018 | Kim et al. | |
| 10,276,594 B2 | 4/2019 | Yamazaki et al. | |
| 2008/0272370 A1* | 11/2008 | Endo .................. | H01L 29/7869 257/43 |
| 2008/0291350 A1* | 11/2008 | Hayashi .............. | H01L 27/1225 349/47 |

(Continued)

FOREIGN PATENT DOCUMENTS

| JP | 6086327 | 1/2017 |
|---|---|---|
| KR | 10-2015-0099319 | 1/2015 |

(Continued)

*Primary Examiner* — Dzung Tran
(74) *Attorney, Agent, or Firm* — F. Chau & Associates, LLC

(57) ABSTRACT

A display device includes: a substrate; a first insulating layer disposed on the substrate and that includes an inorganic insulating material; an oxide semiconductor layer disposed on the first insulating layer; a second insulating layer disposed on the oxide semiconductor layer and that includes an inorganic insulating material; and a third insulating layer disposed on a gate electrode disposed on the second insulating layer and that includes an inorganic insulating material. The oxide semiconductor layer includes a first conductive region, a second conductive region, and a channel region located between the first conductive region and the second conductive region, and a value in the channel region of the oxide semiconductor layer of HC according to equation (1) is less than 30%.

13 Claims, 10 Drawing Sheets

(56) References Cited

U.S. PATENT DOCUMENTS

| | | | |
|---|---|---|---|
| 2009/0065771 A1* | 3/2009 | Iwasaki | H01L 29/78621 257/43 |
| 2010/0025678 A1* | 2/2010 | Yamazaki | H01L 27/1225 257/43 |
| 2010/0159639 A1* | 6/2010 | Sakata | H01L 29/41733 438/104 |
| 2015/0179724 A1* | 6/2015 | Lee | H01L 27/3265 257/40 |
| 2015/0295058 A1 | 10/2015 | Morita et al. | |
| 2016/0307979 A1* | 10/2016 | Lee | H01L 27/1222 |

FOREIGN PATENT DOCUMENTS

| | | |
|---|---|---|
| KR | 10-2016-0122893 | 10/2016 |
| KR | 10-2018-0005311 | 1/2018 |

* cited by examiner

DISPLAY DEVICE AND METHOD OF MANUFACTURING DISPLAY DEVICE

CROSS-REFERENCE TO RELATED APPLICATION

This application claims priority under 35 U.S.C. § 119 from, and the benefit of, Korean Patent Application No. 10-2019-0108938, filed on Sep. 3, 2019 in the Korean Intellectual Property Office, the contents of which are herein incorporated by reference in their entirety.

BACKGROUND

1. Technical Field

One or more embodiments are directed to a display device and a method of manufacturing the display device.

2. Discussion of Related Art

The purposes of display devices are diversifying. In addition, as display devices have become thinner and more lightweight, their range of use has gradually extended. In particular, as the demand for high resolution and large area display devices increases, there is a need for a high-quality thin-film transistor that can be miniaturized and not be influenced by a voltage drop.

SUMMARY

One or more embodiments include a display device that includes a transistor that includes an oxide semiconductor layer, and a method of manufacturing the display device.

According to one or more embodiments, a display device includes a substrate, a first insulating layer disposed on the substrate and that includes an inorganic insulating material, an oxide semiconductor layer disposed on the first insulating layer, a second insulating layer disposed on the oxide semiconductor layer and that includes an inorganic insulating material, a gate electrode disposed on the second insulating layer, and a third insulating layer disposed on the gate electrode and that includes an inorganic insulating material. The oxide semiconductor layer includes a first conductive region, a second conductive region, and a channel region located between the first conductive region and the second conductive region. A hydrogen concentration of the oxide semiconductor layer is within a range from about $5 \times 10^{20}$ atom/cm$^3$ to about $2 \times 10^2$ atom/cm$^3$, and a value in the channel region of the oxide semiconductor layer of HC according to Equation (1) is less than 30%: HC[%]=(Max−Min)/Avg×100 - - - Equation (1), where Max represents a maximum hydrogen concentration value detected from a plurality of points within the channel region, Min represents a minimum hydrogen concentration value detected from a plurality of points within the channel region, and Avg represents an average hydrogen concentration value detected from a plurality of points within the channel region.

A hydrogen concentration of the channel region may be within a range from about $1 \times 10^{21}$ atom/cm$^3$ to about $2 \times 10^{21}$ atom/cm$^3$.

The second insulating layer may include a silicon oxide layer.

At least one of the first insulating layer or the third insulating layer may include a silicon oxide layer or a silicon nitride layer.

The display device may further include a metal layer interposed between the substrate and the first insulating layer.

The oxide semiconductor layer may contain fluorine and a concentration of the fluorine of the oxide semiconductor layer may be in a range from about $5 \times 10^{17}$ atom/cm$^3$ to about $5 \times 10^{18}$ atom/cm$^3$.

The metal layer may include a bottom gate electrode.

According to one or more embodiments, a display device includes a substrate, a first transistor and a second transistor each disposed over the substrate, where one of the first transistor and the second transistor includes an oxide semiconductor layer that includes a channel region, a first conductive region, and a second conductive region, where the first conductive region and the second conductive region are located on two opposite sides of the channel region, respectively, a first insulating layer interposed between the substrate and the oxide semiconductor layer, a gate electrode that overlaps the channel region of the oxide semiconductor layer, a second insulating layer interposed between the oxide semiconductor layer and the gate electrode, and a third insulating layer disposed on the second insulating layer and that covers the gate electrode. A hydrogen concentration of the oxide semiconductor layer is within a range from about $5 \times 10^{20}$ atom/cm$^3$ to about $2 \times 10^{21}$ atom/cm$^3$, and a value in the channel region of the oxide semiconductor layer of HC according to Equation (1) is less than 30%: HC[%]=(Max−Min)/Avg×100 - - - Equation (1), where Max represents a maximum hydrogen concentration value detected from a plurality of points within the channel region, Min represents a minimum hydrogen concentration value detected from a plurality of points within the channel region, and Avg represents an average hydrogen concentration value detected from a plurality of points within the channel region.

A hydrogen concentration of the channel region may be within a range from about $1 \times 10^{21}$ atom/cm$^3$ to about $2 \times 10^{21}$ atom/cm$^3$.

The display device may further include a bottom metal layer interposed between the substrate and the first insulating layer.

The bottom metal layer may have a same voltage level as that of the gate electrode.

The other of the first transistor and the second transistor may include a silicon transistor.

According to one or more embodiments, a method of manufacturing a display device includes forming, on a substrate, a first insulating layer that includes an inorganic insulating material, forming an oxide semiconductor layer on the first insulating layer, forming, on the oxide semiconductor layer, a second insulating layer that includes an inorganic insulating material, forming a gate electrode on the second insulating layer, and forming, on the gate electrode, a third insulating layer that includes an inorganic insulating material. Forming the third insulating layer is performed by an ammonia-free chemical vapor deposition. The oxide semiconductor layer includes a first conductive region, a second conductive region, and a channel region located between the first conductive region and the second conductive region, and a value in the channel region of the oxide semiconductor layer of HC according to Equation (1) is less than 30%: HC[%]=(Max−Min)/Avg×100 - - - Equation (1), where Max represents a maximum hydrogen concentration value detected from a plurality of points within the channel region, Min represents a minimum hydrogen concentration value detected from a plurality of points within the channel region, and Avg represents an average hydrogen concentration value detected from a plurality of points within the channel region.

A hydrogen concentration of the channel region may be within a range from about $1\times10^{21}$ atom/cm$^3$ to about $2\times10^{21}$ atom/cm$^3$.

The second insulating layer may include a silicon oxide layer, and the silicon oxide layer may cover the channel region, at least a portion of the first conductive region, and at least a portion of the second conductive region.

The method may further include applying heat to the first insulating layer before forming the oxide semiconductor layer.

The method may further include forming a metal layer on the substrate before forming the first insulating layer.

Forming the metal layer may include forming a preliminary layer that includes a metal, and etching the preliminary layer such that the metal layer is overlapped by the channel region of the oxide semiconductor layer, and etching the preliminary layer may include using a gas that includes fluorine.

The oxide semiconductor layer may include fluorine, and a concentration of the fluorine may be in a range from about $5\times10^{17}$ atom/cm$^3$ to about $5\times10^{18}$ atom/cm$^3$.

The above and other aspects and features of certain embodiments of the disclosure will be more apparent from the following description, the accompanying drawings, and claims.

DETAILED DESCRIPTION

Figure 1:
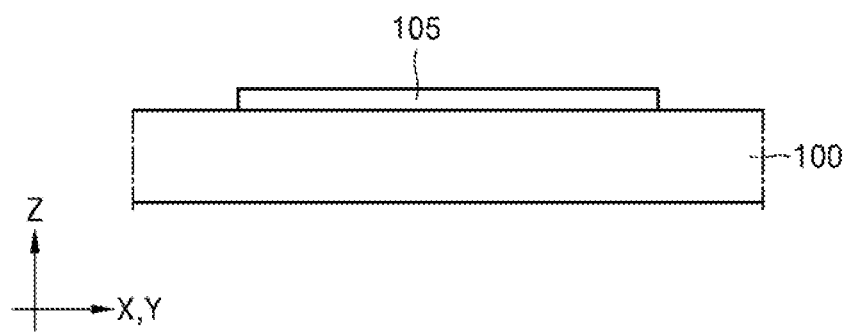
FIGS. 1 to 9 illustrate a process of forming an oxide transistor of a display device according to an embodiment.

Reference will now be made in detail to embodiments, examples of which are illustrated in the accompanying drawings, wherein like reference numerals may refer to like elements throughout. In this regard, embodiments may have different forms and should not be construed as being limited to the descriptions set forth herein.

Hereinafter, embodiments are described in detail with reference to the accompanying drawings. In the drawings, the same reference numerals may be given to the same or corresponding elements, and repeated description thereof is omitted.

Herein, when one value is described as being about equal to another value, e.g. "a width may be from about 0.1 mm to about 1 mm", it is to be understood that the values are equal to each other to within a measurement error, or if measureably unequal, are close enough in value to be functionally equal to each other as would be understood by a person having ordinary skill in the art.

It will be understood that when a layer, region, or component is referred to as being "formed on," another layer, region, or component, it can be directly or indirectly formed on the other layer, region, or component.

Sizes of elements in the drawings may be exaggerated for convenience of explanation.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween.

In the following examples, the x-axis, the y-axis and the z-axis are not limited to three axes of the rectangular coordinate system, and may be interpreted in a broader sense.

For convenience of description, though a display device according to embodiments is described as an organic light-emitting display device as an example, a display device according to the present disclosure is not limited thereto. For example, a display device may be an inorganic light-emitting display.

FIGS. 1 to 9 illustrate a process of forming an oxide transistor of a display device according to an embodiment.

Referring to FIG. 1, according to an embodiment, a metal layer 105 is formed on a substrate 100. The substrate 100 may include a glass material or a polymer resin. For example, the substrate 100 includes a glass material that includes $SiO_2$ as a main component.

According to an embodiment the metal layer 105 has a predetermined width and a predetermined length and is formed by forming a preliminary metal layer and etching the preliminary metal layer. An exemplary, non-limiting etching process is dry etching. The etching uses a gas that includes fluorine. In an embodiment, the metal layer 105 may include a single layer or multiple layers and include one or more of aluminum (Al), molybdenum (Mo), copper (Cu), or titanium (Ti). The metal layer 105 is formed by forming a preliminary metal layer that includes the above materials on the substrate 100 and then etching the preliminary metal layer. For example, the metal layer 105 can be patterned through dry etching that uses sulfur hexafluoride (SF).

Figure 4:
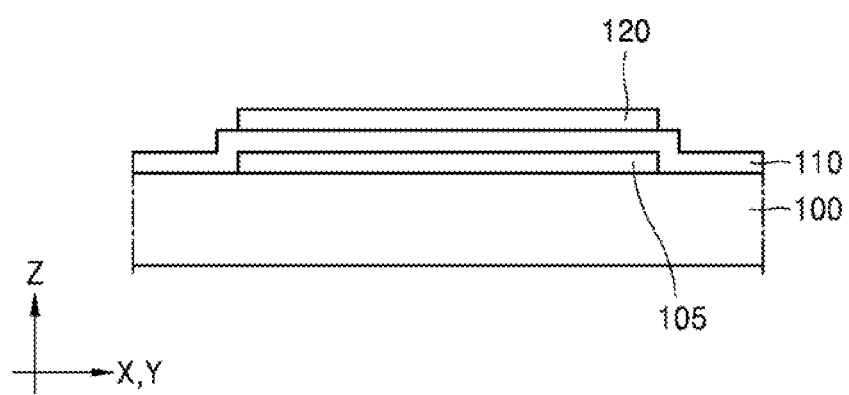

According to an embodiment, the metal layer 105 will overlap at least a portion of an oxide semiconductor layer 120 to be formed during a process described below, shown in FIG. 4. In an embodiment, though it is shown in FIG. 4 that the metal layer 105 entirely covers the oxide semiconductor layer 120, in another embodiment, the metal layer 105 overlaps or covers a portion of the oxide semiconductor layer 120, such as a channel region thereof. The metal layer 105 blocks light incident to the oxide semiconductor layer 120, or serves as a gate electrode of the oxide semiconductor layer 120 by having a predetermined voltage, such as a gate voltage.

Figure 2:
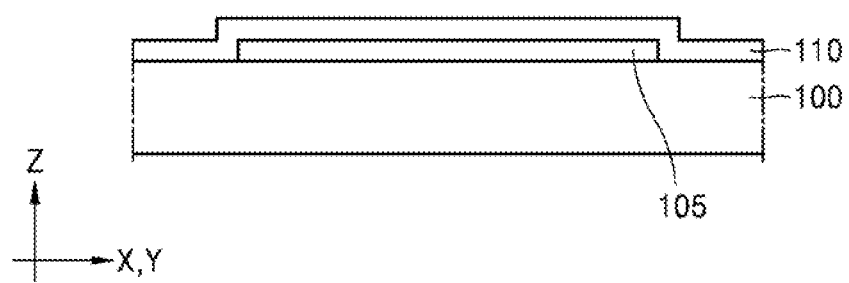

Referring to FIG. 2, according to an embodiment, a bottom (or lower) insulating layer 110 is formed on the substrate 100. The bottom insulating layer 110 includes an inorganic insulating material and is formed by chemical vapor deposition (CVD). For example, the bottom insulating layer 110 is deposited by plasma enhanced chemical vapor deposition (PECVD). Alternatively, in other embodiments, the bottom insulating layer 110 can be deposited by various other deposition methods such as atmospheric pressure CVD (APCVD) or low pressure CVD (LPCVD).

According to an embodiment, the bottom insulating layer 110 includes one or more of silicon oxide, silicon nitride, or silicon oxynitride. The bottom insulating layer 110 may have a single layered structure or a multi-layered structure that includes the above materials. For example, the bottom insulating layer 110 can have a double-layered structure of a silicon nitride layer and a silicon oxide layer.

Compared to a silicon oxide layer, according to an embodiment, a silicon nitride layer is an insulating layer with a relatively high hydrogen content. A process according to an embodiment of forming a silicon nitride layer by using PECVD is described below.

According to an embodiment, the substrate 100 is inserted into a chamber and a plasma atmosphere is formed, the substrate 100 being an object on which deposition is performed. A silicon nitride layer is formed by using silane ($SiH_4$) and ammonia ($NH_3$). In an embodiment, a layer-forming gas used to form a silicon nitride layer includes nitrogen molecules ($N_2$), silane, and ammonia. Silane is decomposed into silicon (Si) and hydrogen (H) by plasma, and ammonia is decomposed into nitrogen (N) and hydrogen (H). While each decomposed atom falls onto the substrate 100 and each fallen atom reacts based on a surface temperature of the substrate 100, a silicon nitride layer is formed on the substrate 100.

According to an embodiment, a silicon oxide layer is formed by PECVD that uses silane and nitrogen oxide ($N_2O$). In this case, the silicon oxide layer contains hydrogen (H). Alternatively, in another embodiment, a silicon oxide layer is formed using a layer-forming gas that includes silicon fluoride and oxygen. For silicon fluoride, silicon tetrafluoride ($SiF_4$) and hexafluoride di silicon ($Si_2F_6$) are used, for example. In the case where a layer-forming gas that includes silicon fluoride is used, a silicon oxide layer includes fluorine (F).

In an embodiment, a silicon oxide layer formed by using silane and nitrogen oxide ($N_2O$) also includes hydrogen (H) and fluorine (F). In this case, fluorine (F) originates from a sulfur hexafluoride gas (SFe) used while the metal layer 105 is etched, or from a cleaning or seasoning process of the chamber during a PECVD process.

Figure 3:
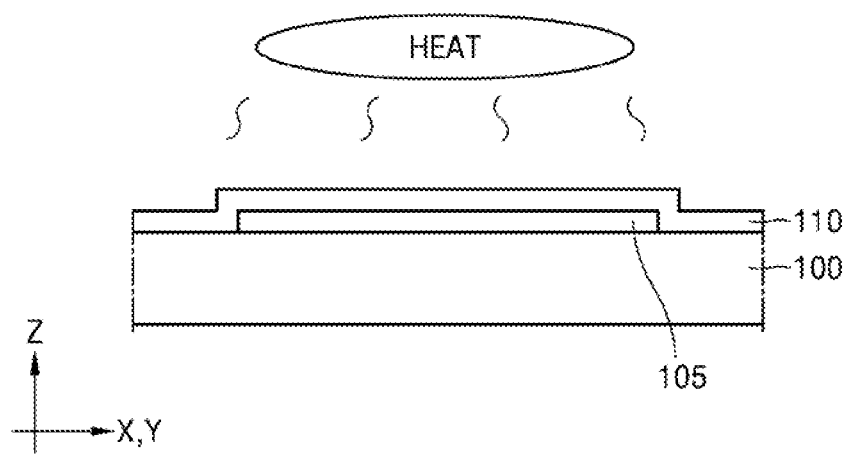

Referring to FIG. 3, according to an embodiment, after the bottom insulating layer 110 is formed, heat treatment process is performed. The bottom insulating layer 110 includes hydrogen (H). Since hydrogen, hydroxyl groups, or moisture can influence the oxide semiconductor layer described below, the concentration thereof is reduced by a heat treatment process in advance.

According to an embodiment, through the heat treatment process, hydrogen (H) or fluorine (F) in the bottom insulating layer 110 is removed. The heat treatment process is performed at temperature higher than about 400° C., for example, at about 460° C. for about one hour. Through the heat treatment process, the hydrogen (H) or fluorine (F) concentration in the bottom insulating layer 110 is reduced.

Referring to FIG. 4, according to an embodiment, an oxide semiconductor layer 120 is formed on the bottom insulating layer 110. The oxide semiconductor layer 120 includes one of Zn oxide, In—Zn oxide, or Ga—In—Zn oxide as a Zn oxide-based material. The oxide semiconductor layer 120 includes a semiconductor that includes the Zn oxide-based material containing a metal such as In, Ga, and/or Sn. For example, the oxide semiconductor layer 120 may include one of an IGZO (In—Ga—Zn—O) semiconductor, an ITZO (In—Sn—Zn—O) semiconductor, or an IGTZO (In—Ga—Sn—Zn—O) semiconductor.

In an embodiment, the oxide semiconductor layer 120 is formed through a sputtering method by using an In—Ga—Zn—O-based oxide target. The oxide semiconductor layer 120 is formed by a sputtering method in, for example, an inert gas, such as argon, atmosphere, an oxygen atmosphere, or a mixed atmosphere that includes an inert gas and oxygen.

Figure 5:
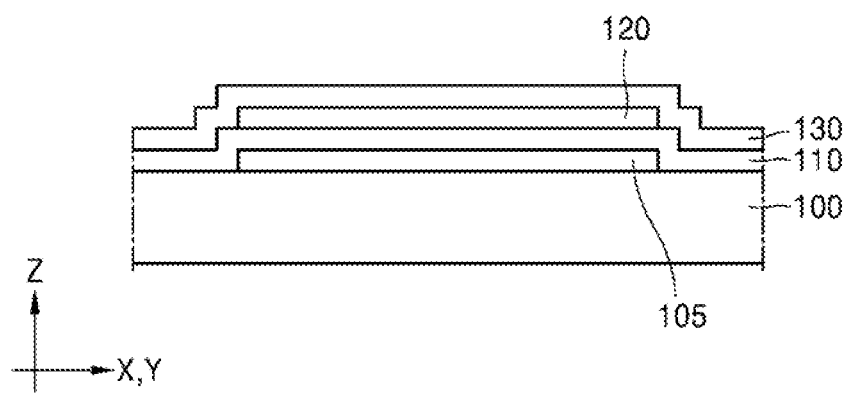

Referring to FIG. 5, according to an embodiment, an intermediate insulating layer 130 is formed on the oxide semiconductor layer 120. The intermediate insulating layer 130 includes an inorganic insulating material. The intermediate insulating layer 130 functions as a gate insulating layer interposed between a gate electrode described below and the oxide semiconductor layer 120.

According to an embodiment, the intermediate insulating layer 130 entirely covers the substrate 100. For example, a top surface of the oxide semiconductor layer 120, shown in FIG. 3, is entirely covered by the intermediate insulating layer 130. When the intermediate insulating layer 130 includes silicon nitride, since silicon nitride already includes a relatively high hydrogen content as described above, during a process of forming the intermediate insulating layer 130, the oxide semiconductor layer 120 thereunder entirely becomes conductive. In this case, the oxide semiconductor layer 120 may not function as an active layer of a transistor. Therefore, the intermediate insulating layer 130 is formed to include silicon oxide.

According to an embodiment, like the process of forming the bottom insulating layer 110 described with reference to FIG. 2, the intermediate insulating layer 130 is formed by a CVD process, such as PECVD, APCVD, or LPCVD, etc. A specific forming process is the same as that described above.

Figure 6:
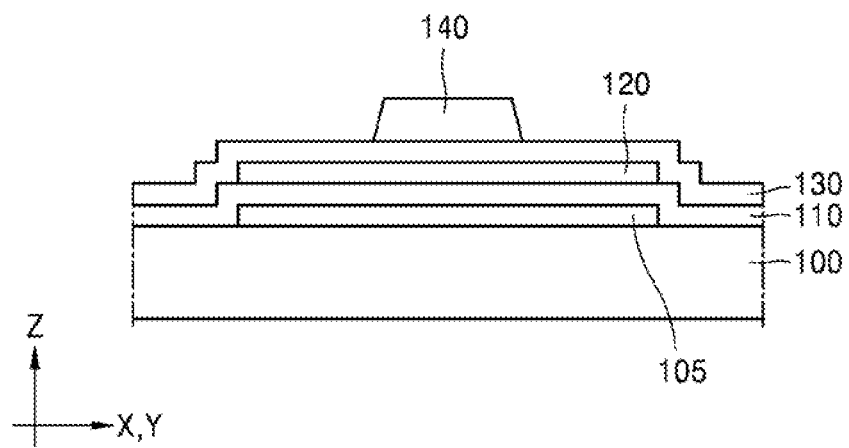

Referring to FIG. 6, according to an embodiment, a gate electrode 140 is formed on the intermediate insulating layer 130. The gate electrode 140 may include a single layer or multiple layers that include one or more of aluminum (Al), molybdenum (Mo), copper (Cu), or titanium (Ti). The gate electrode 140 overlaps a portion of the oxide semiconductor layer 120.

Figure 7:
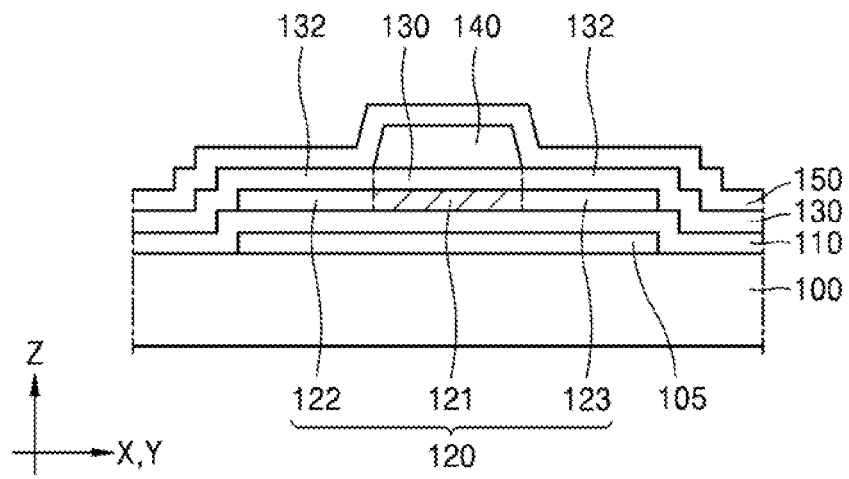

Referring to FIG. 7, according to an embodiment, a top (or upper) insulating layer 150 is formed on the gate electrode 140. The top insulating layer 150 includes an inorganic insulating material. The top insulating layer 150 includes one or more of silicon oxide, silicon nitride, or silicon oxynitride. The top insulating layer 150 may be a single layer or a multi-layer structure that includes the above materials. For example, the top insulating layer 150 is a double-layered structure of a silicon nitride layer and a silicon oxide layer.

According to an embodiment, like the process of forming the bottom insulating layer 110 described with reference to FIG. 2, the top insulating layer 150 is formed by a CVD process, such as PECVD, APCVD, or LPCVD, etc.

Hydrogen that originates from gases used during the process of forming the top insulating layer 150, such as those used in PECVD, can contribute to conductorizing a portion of the oxide semiconductor layer 120. For example, according to an embodiment, a portion of the oxide semiconductor layer 120 that does not overlap the gate electrode 140 can become conductive by the above-described hydrogen, and the oxide semiconductor layer 120 will include a channel region 121, a first conductive region 122, and a second conductive region 123. The first conductive region 122 and the second conductive region 123 are on two opposite sides of the channel region 121.

According to an embodiment, when a large amount of hydrogen is generated during the process of forming the top insulating layer 150, an area of the oxide semiconductor layer 120 that becomes conductive by hydrogen increases, and thus a length of the channel region 121 is reduced.

To prevent this occurrence, according to an embodiment, a silicon nitride layer is formed as the top insulating layer 150 by an ammonia (NH)-free PECVD. In this case, the silicon nitride layer is formed by using silane and a nitrogen gas ($N_2$). Since the ammonia ($NH_3$)-free PECVD includes a small amount of hydrogen compared to the above-described PECVD, the hydrogen concentration in a silicon nitride layer formed by the ammonia ($NH_3$)-free PECVD is relatively low, which prevents reducing the length of the channel region.

Figure 8:
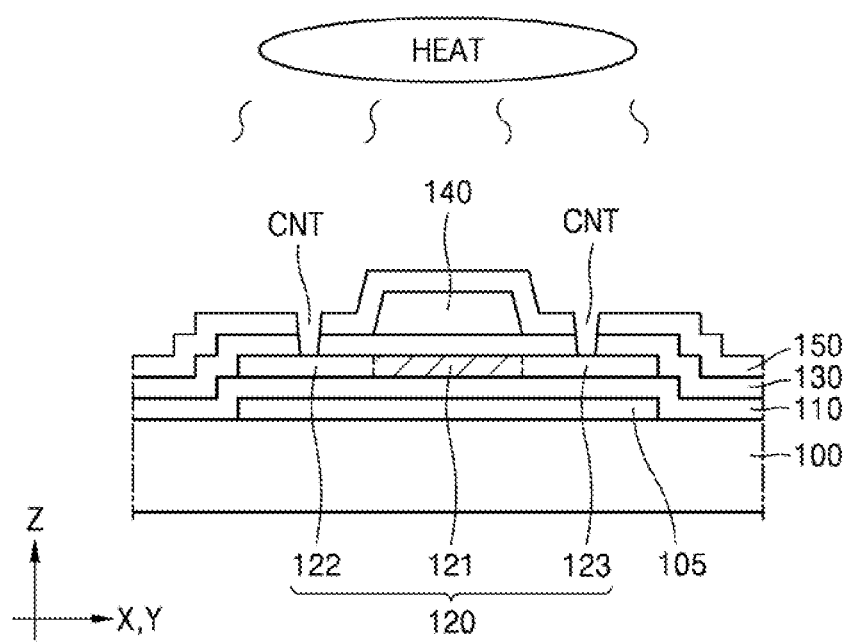

Referring to FIG. 8, according to an embodiment, after contact holes CNT are formed that expose the conductive regions of the oxide semiconductor layer 120, such as one or both of the first and second conductive regions 122 and 123, an annealing process is performed. In an embodiment, the annealing process is performed at temperature of about 350° C. or more, or temperature of about 400° C. or more.

According to an embodiment, conductorization of the oxide semiconductor layer 120 occurs secondarily through the annealing process. Before and after the annealing process, the hydrogen concentration of the first and second conductive regions 122 and 123 changes. For example, the hydrogen concentration of the first and second conductive regions 122 and 123 after the annealing process is higher than the hydrogen concentration of the first and second conductive regions 122 and 123 before the annealing process. One of the first and second conductive regions 122 and 123 corresponds to a source region, and the other of the first and second conductive regions 122 and 123 corresponds to a drain region.

Figure 9:
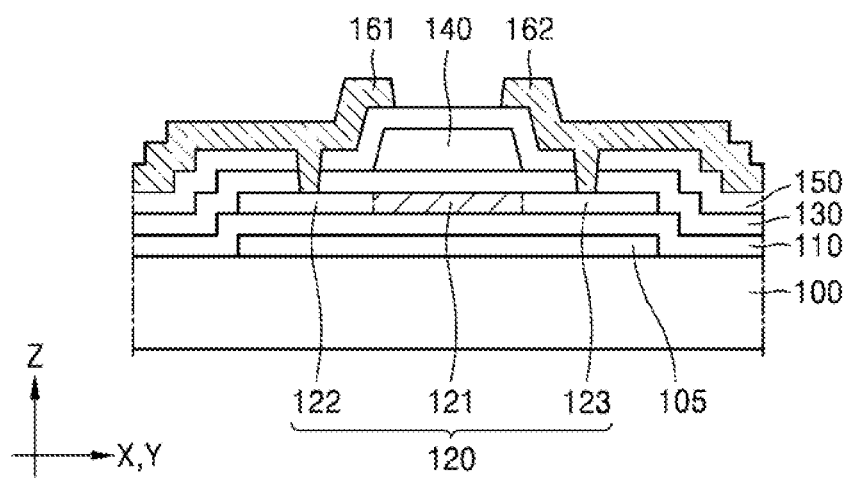

Referring to FIG. 9, according to an embodiment, an electrode layer is formed that connects to at least one of the first or second conductive regions 122 or 123. In an embodiment, FIG. 9 shows a first electrode layer 161 and a second electrode layer 162 respectively connected to the first and second conductive regions 122 and 123. One of the first and second electrode layers 161 and 162 corresponds to a source electrode of a transistor, and the other of the first and second electrode layers 161 and 162 corresponds to a drain electrode of the transistor.

According to an embodiment, the first electrode layer 161 and the second electrode layer 162 are each a single layer or a multi-layer structure that includes on or more of aluminum (Al), molybdenum (Mo), copper (Cu), or titanium (Ti). After a layer that includes the above materials is formed, the first electrode layer 161 and the second electrode layer 162 are patterned through a process such as dry etching.

Figure 10:
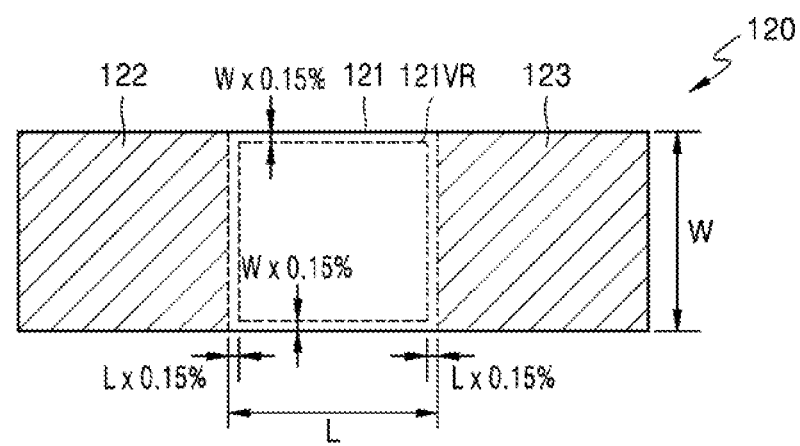
FIG. 10 is a plan view of an oxide semiconductor layer of an oxide transistor according to an embodiment.

FIG. 10 is a plan view of an oxide semiconductor layer of an oxide transistor according to an embodiment.

Referring to FIG. 10, according to an embodiment, the oxide semiconductor layer 120 includes the channel region 121, the first conductive region 122, and the second conductive region 123, the first conductive region 122 being on a first side of the channel region 121, and the second conductive region 123 being on a second side of the channel region 121. The oxide semiconductor layer 120 includes a Zn oxide-based material. The Zn oxide-based material includes one or more of Zn oxide, In—Zn oxide, or Ga—In—Zn oxide, etc. The oxide semiconductor layer 120 include a semiconductor that includes a Zn oxide-based material that contains one or more of a metal such as In, Ga, or Sn. For example, the oxide semiconductor layer 120 includes one of an IGZO (In—Ga—Zn—O) semiconductor, an ITZO (In—Sn—Zn—O) semiconductor, or an IGTZO (In—Ga—Sn—Zn—O) semiconductor.

According to an embodiment, the hydrogen concentration of the first conductive region 122 and the second conductive region 123 is higher than the hydrogen concentration of the channel region 121. Since hydrogen is introduced into the first and second conductive regions 122 and 123 through one or both of the process of forming the top insulating layer 150 or the annealing process described with reference to FIGS. 1 to 9, the hydrogen concentration of the first and second conductive regions 122 and 123 is higher than the hydrogen concentration of the channel region 121.

According to an embodiment, a typical hydrogen concentration of the oxide semiconductor layer 120 is in a range from about $5 \times 10^{20}$ atom/cm$^3$ to about $2 \times 10^{21}$ atom/cm$^3$. The hydrogen concentration of the channel region 121 of the oxide semiconductor layer 120 is in a range from about $1 \times 10^{21}$ atom/cm$^3$ to about $2 \times 10^{21}$ atom/cm$^3$.

According to an embodiment, when a difference in hydrogen concentrations for each measurement point of the channel region 121 is large, a driving performance of a display device that includes an oxide semiconductor deteriorates, and a display quality of the display device also deteriorates. In contrast, in the channel region 121 of the oxide semiconductor layer 120 manufactured according to the above process, a hydrogen concentration value HC in Equation (1) below is less than 30%.

$$HC[\%] = (Max - Min)/Avg \times 100 \quad \text{Equation (1)},$$

where Max represents a maximum hydrogen concentration value detected from a plurality of points within the channel region 121, Min represents a minimum hydrogen concentration value detected from a plurality of points within the channel region 121, and Avg represents an average hydrogen concentration value detected from a plurality of points within the channel region 121. When the above condition is not met, a channel length of the channel region 121 cannot be sufficiently secured, and the display quality of the display device may not be secured due to, e.g., the occurrence of a leakage current. More properly, the HC value according to Equation (1) may be 20% or less.

According to an embodiment, the hydrogen concentration of the channel region 121 is measured in a valid region 121VR that is defined inward from the edges of the channel region 121. Letting W be a width of the channel region 121 in a width direction, and L be a length of the channel region 121 between the first and second conductive regions 122 and 123, edge regions of the channel region 121 having a width or length of about 0.15%×L and 0.15%×W are where noise occurs when measuring hydrogen concentration. Thus, hydrogen concentration is measured within a region, hereinafter, referred to as a valid region 121VR, marked in FIG. 10, that is separated from the edges of the channel region by about 0.15%×L and 0.15%×W. In an embodiment, FIG. 10 shows that the valid region 121VR has a quadrilateral shape. In an embodiment, the valid region 121VR has a curved or serpentine shape. The valid region 121VR spaced apart from edges of the channel region 121, has a length corresponding to about 99.7%×L and a width corresponding to about 99.7%×W. In an embodiment, the length L of the channel region 121 is about 10 μm or less.

In an embodiment, hydrogen concentration of the valid region 121VR of the channel region 121 is in a range from about $5 \times 10^{20}$ atom/cm$^3$ to about $2 \times 10^{21}$ atom/cm$^3$, and the hydrogen concentration at an arbitrary first point within the valid region 121VR is less than twice the hydrogen concentration at a second point. For example, hydrogen concentration of the valid region 121VR of the channel region 121 may be in a range from about $1 \times 10^{21}$ atom/cm$^3$ to about $2 \times 10^{21}$ atom/cm$^3$.

According to an embodiment, the oxide semiconductor layer 120 includes fluorine acquired through the process of forming the metal layer 105 described with reference to FIG. 1. For example, the fluorine concentration of the channel region 121 of the oxide semiconductor layer 120 is less than the fluorine concentration of the first conductive region 122 or the second conductive region 123. In an embodiment, the fluorine concentration of the channel region 121 is in a range from about $5 \times 10^{17}$ atom/cm$^3$ to about $5 \times 10^{18}$ atom/cm$^3$.

According to an embodiment, the hydrogen concentration and the fluorine concentration can be measured through secondary ion mass spectroscopy (SIMS).

Figure 11:
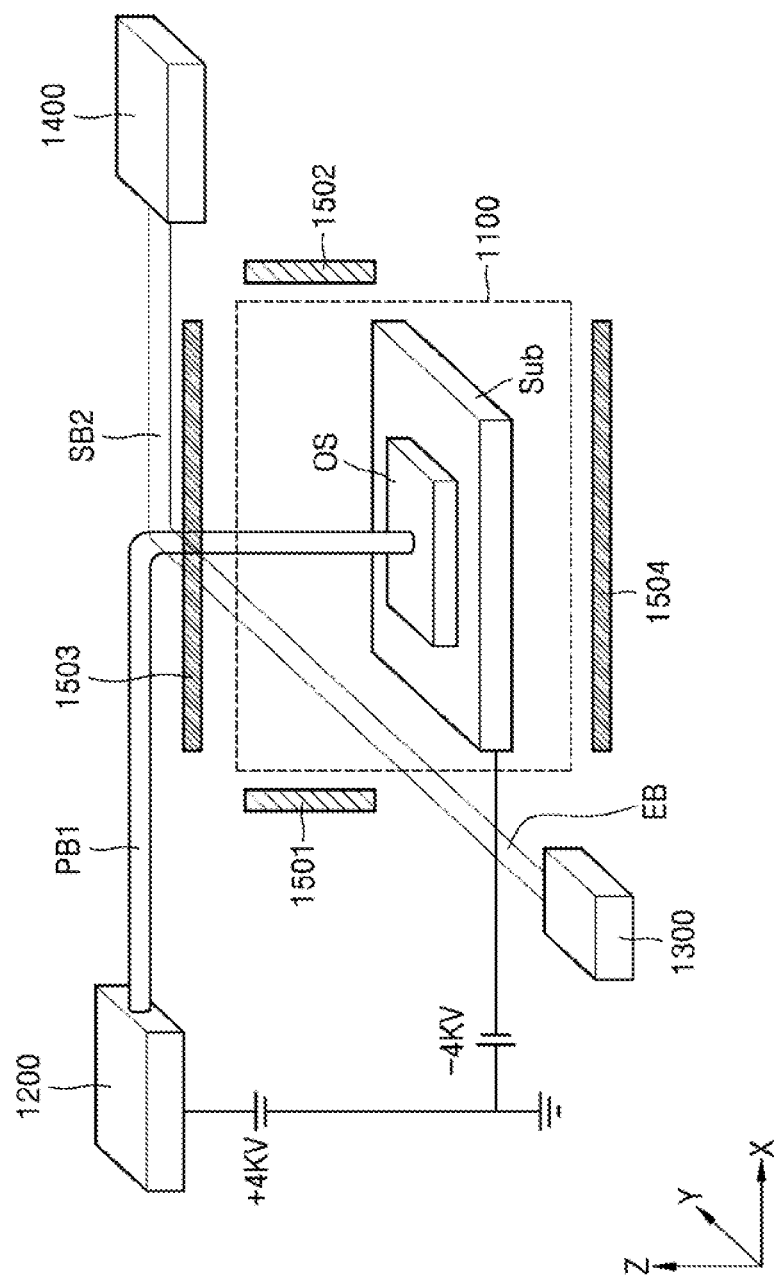
FIG. 11 illustrates a secondary ion mass spectroscopy apparatus that measures the concentration of hydrogen or fluorine of an oxide transistor according to an embodiment.

FIG. 11 illustrates a secondary ion mass spectroscopy apparatus that measures concentration of hydrogen or fluorine of an oxide transistor according to an embodiment.

Referring to FIG. 11, the SIMS apparatus includes a chamber 1100, a primary ion source 1200, an electron generating source 1300, and a secondary ion optical system 1400.

According to an embodiment, the primary ion source 1200 generates and emits an ion beam. The primary ion source 1200 emits a primary ion beam toward a sample positioned inside the chamber 1100, such as an oxide semiconductor layer OS on a substrate Sub. The chamber 1100 is in a vacuum state.

According to an embodiment, the primary ion source 1200 emits a primary ion beam PB1 that includes cesium ions (Cs$^+$). After the primary ion beam PB1 is irradiated onto the sample, a secondary ion SB2 emitted from the sample propagates to the secondary ion optical system 1400 through a sputtering phenomenon. The primary ion beam PB1 and the secondary ion SB2 propagate in directions perpendicular to the sample, such as the oxide semiconductor layer OS. For example, a channel of the primary ion beam PB1 and a channel of the secondary ion SB2 are on the same axis.

According to an embodiment, the electron generating source 1300 includes an electron gun that emits electrons to prevent the sample from being charged by the sputtering ions.

According to an embodiment, the SIMS apparatus shown in FIG. 11 applies a predetermined voltage to the substrate Sub, such as a glass substrate. Since a glass substrate has a low electrical conductivity as compared to a wafer, even when the electron generating source 1300 is provided, there is a limit to preventing the charging, and the ion propagation paths can be twisted.

According to an embodiment, to prevent the twisting of the paths, first to fourth wire portions 1501, 1502, 1503, and 1504 are disposed outside the chamber 1100 to generate an electromagnetic field. The electromagnetic field is formed in an X-axis direction or a Y-axis direction, and a Z-axis direction. Distortion of an ion beam path, such as the primary ion beam or the secondary ion, can be prevented by the electromagnetic field. In an embodiment, the first to fourth wire portions 1501, 1502, 1503, and 1504 include an enamel wire.

According to an embodiment, despite preventing charging by using the electron generating source 1300 and correcting the beam correction by using the first to fourth wire portions 1501, 1502, 1503, and 1504, when the substrate Sub includes a glass substrate, a high voltage applied to the substrate Sub can cause cracks in the glass. In addition, the occurrence of charging on a surface of a test piece can distort a detected image. Therefore, a method in which an equipment source lowers an acceleration voltage is used. For example, an absolute value of a power voltage supplied to the SIMS apparatus is about 4 kV. A voltage applied to a test piece, such as the glass substrate, is about −4 kV, and a voltage applied to the primary ion source 1200 is about +4 kV.

Figure 12:
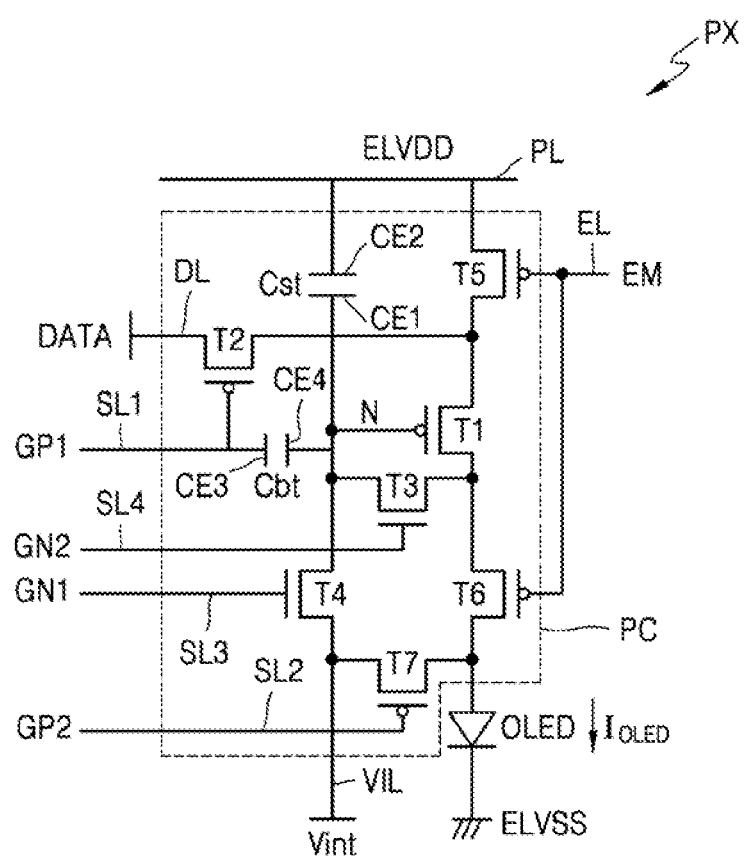
FIG. 12 is an equivalent circuit diagram of one pixel of a display device according to an embodiment.

FIG. 12 is an equivalent circuit diagram of one pixel of a display device according to an embodiment.

Referring to FIG. 12, according to an embodiment, a pixel PX of the display device includes a pixel circuit PC and a light-emitting diode, such as an organic light-emitting diode OLED electrically connected to the pixel circuit PC.

According to an embodiment, the pixel PX includes a plurality of first to seventh transistors T1, T2, T3, T4, T5, T6, and T7, a first capacitor Cst, a second capacitor Cbt, the organic light-emitting diode OLED as a display element, signal lines SL1, SL2, SL3, SL4, EL, and DL, an initialization voltage line VIL, and a power voltage line PL connected thereto. In another embodiment, at least one of the signal lines SL1, SL2, SL3, SL4, EL, or DL, the initialization voltage line VIL or the power voltage line PL may be shared by neighboring pixels. In FIG. 12, the third transistor T3 and the fourth transistor T4 are provided as n-channel metal oxide semiconductor (NMOS) field effect transistors, and the remaining transistors are provided as p-channel metal oxide semiconductor (PMOS) field effect transistors.

According to an embodiment, the signal lines include a plurality of the data lines DL, a plurality of the first scan lines S1, a plurality of the second scan lines SL2, a plurality of the third scan lines SL3, a plurality of the fourth scan lines SL4, and a plurality of the emission control lines EL. In an embodiment, the second scan line SL2 is connected to the first scan line SL1. In this case, a first scan signal GP1 is a second scan signal GP2.

According to an embodiment, the power voltage line PL transmits a first power voltage ELVDD to the first transistor T1, and the initialization voltage line VIL transmits an initialization voltage Vint to a pixel PX, where the initialization voltage Vint initializes the first transistor T1 and the organic light-emitting diode OLED.

According to an embodiment, the first scan line S1, the second scan line SL2, the third scan line SL3, the fourth scan line SL4, the emission control line EL, and the initialization voltage line VIL extend in a first direction and be spaced apart from each other. The data line DL and the power voltage line PL extend in a second direction that crosses the first direction and be spaced apart from each other.

According to an embodiment, the first transistor T1 is connected to the power voltage line PL through the fifth transistor T5 and electrically connected to the organic light-emitting diode OLED through the sixth transistor T6. The first transistor T1 serves as a driving transistor, receives a data signal DATA and supplies a driving current OLED to the organic light-emitting diode OLED according to a switching operation of the second transistor T2.

According to an embodiment, the second transistor T2 is connected to the first scan line SL1 and the data line DL and connected to the power voltage line PL through the fifth transistor T5. The second transistor T2 is turned on in response to a first scan signal GP1 received through the first scan line SL1 and performs a switching operation of transmitting a data signal DATA received through the data line DL to a node N.

According to an embodiment, the third transistor T3 is connected to the fourth scan line SL4 and electrically connected to the organic light-emitting diode OLED through the sixth transistor T6. The third transistor T3 is turned on in response to a fourth scan signal GN2 received through the fourth scan line SL4 and diode-connects the first transistor T1.

According to an embodiment, the fourth transistor T4 is connected to the third scan line SL3 and the initialization voltage line VIL, turned on in response to a third scan signal GN1 received through the third scan line S3, and transmits the initialization voltage Vint from the initialization voltage line VIL to a gate electrode of the first transistor T1, thereby initializing a voltage of the gate electrode of the first transistor T1.

According to an embodiment, the fifth transistor T5 and the sixth transistor T6 are connected to the emission control line EL, simultaneously turned on in response to an emission control signal EM received through the emission control line EL, and constitute a current path such that the driving current $I_{OLED}$ flows to the organic light-emitting diode OLED from the power voltage line PL.

According to an embodiment, the seventh transistor T7 is connected to the second scan line SL2 and the initialization voltage line VIL, is turned on in response to a second scan signal GP2 received through the second scan line SL2, transmits the initialization voltage Vint from the initialization voltage line VIL to the organic light-emitting diode OLED, thereby initializing the organic light-emitting diode OLED. In some embodiments, the seventh transistor T7 is omitted.

According to an embodiment, the first capacitor Cst includes a first electrode CE1 and a second electrode CE2. The first electrode CE1 is connected to the gate electrode of the first transistor T1, and the second electrode CE2 is connected to the power voltage line PL. The first capacitor Cst is a storage capacitor. The first capacitor Cst stores and maintains a voltage that corresponds to a difference between two opposite end portions of the power voltage line PL and the gate electrode of the first transistor T1, thereby maintaining a voltage applied to the gate electrode of the first transistor T1.

According to an embodiment, the second capacitor Cbt includes a third electrode CE3 and a fourth electrode CE4. The third electrode CE3 is connected to the first scan line SL1 and the gate electrode of the second transistor T2. The fourth electrode CE4 is connected to the gate electrode of the first transistor T1 and the first electrode CE1 of the first capacitor Cst. The second capacitor Cbt is a boosting capacitor. When a first scan signal GP1 of the first scan line SL is a voltage that turns off the second transistor T2, the second capacitor Cbt raises a voltage of the node N and reduces a black voltage that displays black.

According to an embodiment, the organic light-emitting diode OLED is electrically connected to the pixel circuit PC, including the transistors and the capacitors. The organic light-emitting diode OLED includes a pixel electrode and an opposite electrode. The opposite electrode receives a second power voltage ELVSS. The organic light-emitting diode OLED displays an image by receiving the driving current 100 from the first transistor T1 and emitting light.

In a present embodiment, at least one of the plurality of transistors T1, T2, T3, T4, T5, T6, or T7 includes an oxide semiconductor layer, and the remaining transistors include a silicon semiconductor layer. Specifically, the first transistor T1 that directly influences the brightness of the display device includes a semiconductor layer that includes a highly reliable polycrystalline silicon, and a high resolution display device can be implemented by this configuration.

According to an embodiment, since an oxide semiconductor has a high carrier mobility and a low leakage current, a voltage drop is not large even when a driving time is long. That is, since an image color change that corresponds to a voltage drop is not large even during low frequency driving, the display device can be driven at a low frequency. Since an oxide semiconductor has a low leakage current, at least one of the fourth transistor T4 or the third transistor T3 that is connected to the gate electrode of the first transistor T1 may include an oxide semiconductor, and thus a leakage current that may flow to the gate electrode of the first transistor T1 is prevented, and simultaneously, power consumption is reduced.

Figure 13:
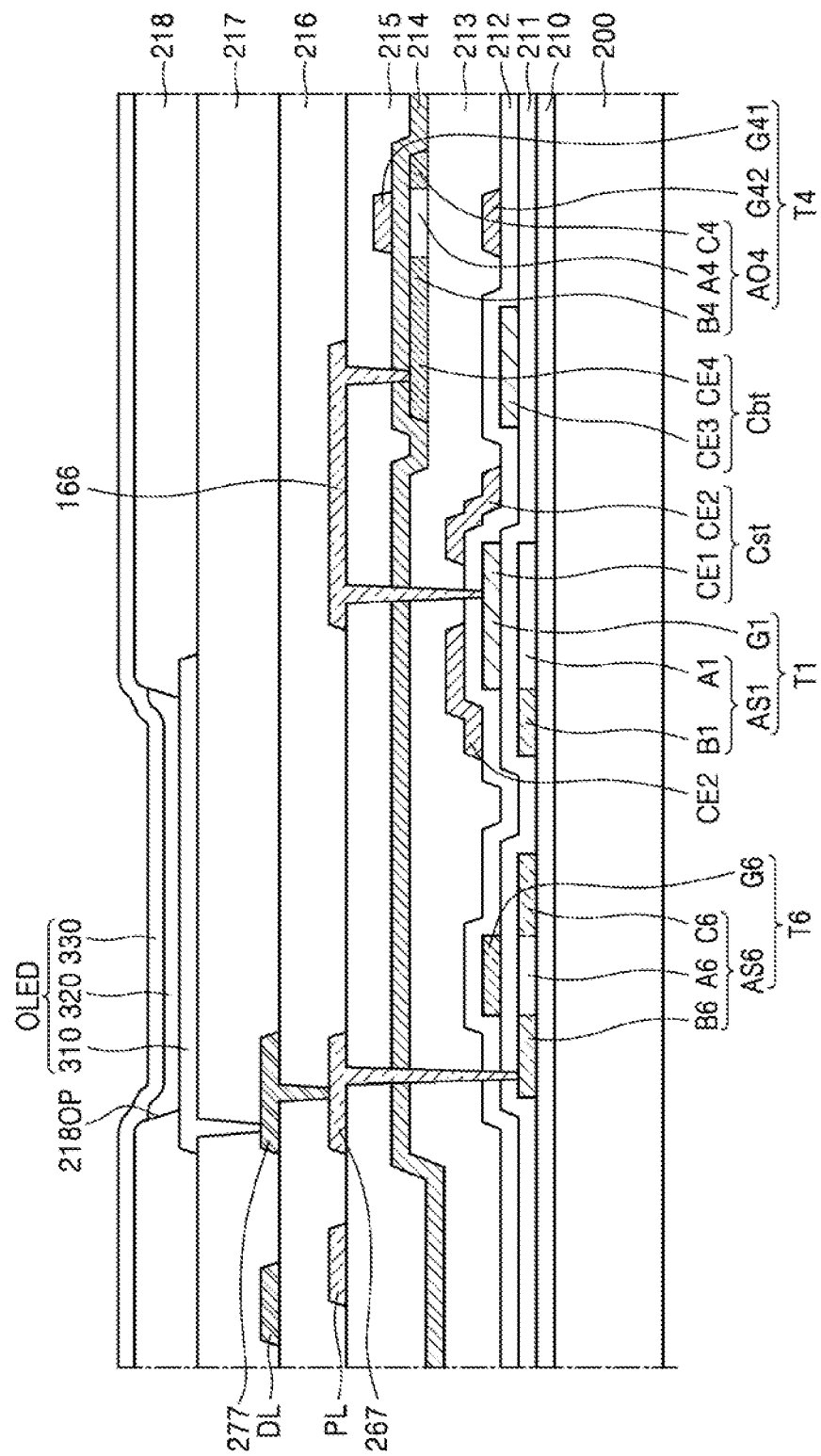
FIG. 13 is a cross-sectional view of a display device according to an embodiment.

FIG. 13 is a cross-sectional view of a display device according to an embodiment. FIG. 13 shows a partial region of the display device and shows a substrate 200, a first transistor T1 and a sixth transistor T6 that include a silicon semiconductor, a fourth transistor T4 that includes an oxide semiconductor, a first capacitor Cst, and a second capacitor Cbt.

According to an embodiment, the substrate 200 includes one of a glass material, a ceramic material, a metal material, or a flexible or bendable material. When the substrate 200 includes a flexible or bendable material, the substrate 200 includes a polymer resin such as polyethersulfone (PES), polyarylate, polyetherimide (PEI), polyethylene naphthalate (PEN), polyethylene terephthalate (PET), polyphenyene sulfide (PPS), polyimide (PI), polycarbonate (PC), or cellulose acetate propionate (CAP).

According to an embodiment, a buffer layer 210 is disposed on the substrate 200 that raises a flatness of the top surface of the substrate 200 and includes an inorganic insulating material such as silicon oxide, silicon nitride, or silicon oxynitride.

According to an embodiment, a first semiconductor layer AS1 of the first transistor T1 and a sixth semiconductor layer AS6 of the sixth transistor T6 are disposed on the buffer layer 210. The first semiconductor layer AS1 and the sixth semiconductor layer AS6 include a silicon semiconductor. In an embodiment, FIG. 13 shows a first high-concentration impurity region B1 and a channel region A1 of the first semiconductor layer AS1, and first and second high-concentration impurity regions B6 and C6 and a channel region A6 of the sixth semiconductor layer AS6. The first high-concentration impurity region B1 is doped with impurities and is conductive, and first and second high concentration impurity regions B6 and B6 are also doped with impurities and are conductive.

According to an embodiment, a first gate electrode G1 of the first transistor T1 and a sixth gate electrode G6 of the sixth transistor T6 are respectively located over the first semiconductor layer AS1 and the sixth semiconductor layer AS6. A first insulating layer 211 is disposed between the first semiconductor layer AS1 and the first gate electrode G1 and between the sixth semiconductor layer AS6 and the sixth gate electrode G6.

According to an embodiment, the first insulating layer 211 includes an inorganic material that includes one or more of an oxide or a nitride. For example, the first insulating layer 211 includes one or more of silicon oxide, silicon nitride, silicon oxynitride, aluminum oxide, titanium oxide, tantalum oxide, or hafnium oxide.

According to an embodiment, the first gate electrode G1 overlaps a channel region A1 of the first semiconductor layer AS1, and the sixth gate electrode G6 overlaps a channel region A6 of the sixth semiconductor layer AS6. The first gate electrode G1 and the sixth gate electrode G6 may each include a single layer or multiple layers that including one or more of molybdenum (Mo), copper (Cu), or titanium (Ti).

According to an embodiment, the first electrode CE1 of the first capacitor Cst and the third electrode CE3 of the second capacitor Cbt are disposed on the same layer as the first gate electrode G1 and the sixth gate electrode G6. The first electrode CE1 of the first capacitor Cst and the third electrode CE3 of the second capacitor Cbt include the same material as the first gate electrode G1 and the sixth gate electrode G6.

According to an embodiment, a second insulating layer 212 is disposed on the first gate electrode G1 and the sixth gate electrode G6. The second insulating layer 212 includes an inorganic material that includes one or more of an oxide or a nitride. For example, the second insulating layer 212 includes one or more of silicon oxide, silicon nitride, silicon oxynitride, aluminum oxide, titanium oxide, tantalum oxide, or hafnium oxide.

According to an embodiment, the second electrode CE2 of the first capacitor Cst is disposed on the second insulating layer 212 and overlaps the first electrode CE1 of the first capacitor Cst. The second electrode CE2 may have a single layer or a multi-layer structure that includes one or more of molybdenum (Mo), copper (Cu), or titanium (Ti).

According to an embodiment, a third insulating layer 213 is disposed on the second electrode CE2 of the first capacitor Cst. The third insulating layer 213 includes an inorganic material that includes an oxide or a nitride. For example, the third insulating layer 213 includes one or more of silicon oxide, silicon nitride, silicon oxynitride, aluminum oxide, titanium oxide, tantalum oxide, or hafnium oxide.

According to an embodiment, the first capacitor Cst overlaps the first transistor T1. For example, the first gate electrode G1 of the first transistor T1 serves as the first electrode CE1 of the first capacitor Cst.

According to an embodiment, a fourth semiconductor layer AO4 of the fourth transistor T4 includes an oxide semiconductor and is disposed on the third insulating layer 213. The fourth semiconductor layer AO4 includes first and second conductive regions B4 and C4, and a channel region A4 therebetween, the first and second conductive regions B4 and C4 being conductive and spaced apart from each other. The fourth semiconductor layer AO4 includes Zn oxide, In—Zn oxide, or Ga—In—Zn oxide, etc.

According to an embodiment, the fourth transistor T4 includes a dual gate electrode. For example, a first gate electrode G41 is disposed over the fourth semiconductor layer AO4 of the fourth transistor T4, and a second gate electrode G42 is disposed below the fourth semiconductor layer AO4. The first gate electrode G41 and the second gate electrode G42 overlap the channel region A4 of the fourth semiconductor layer AO4.

According to an embodiment, a fourth insulating layer 214 is disposed on the third insulating layer 213 and covers the fourth semiconductor layer AO4, and includes an inorganic material that includes an oxide or a nitride. For example, the fourth insulating layer 214 includes one or more of silicon oxide, silicon nitride, silicon oxynitride, aluminum oxide, titanium oxide, tantalum oxide, or hafnium oxide.

According to an embodiment, the first gate electrode G41 and the second gate electrode G42 include a single layer or a multi-layer structure that includes one or more of molybdenum (Mo), copper (Cu), or titanium (Ti).

According to an embodiment, a fifth insulating layer 215 is disposed on the fourth insulating layer 214 and covers the fourth transistor T4. The power voltage line PL, a first connection electrode 267 and a connecting line 166 are disposed on the fifth insulating layer 215. The fifth insulating layer 215 includes an inorganic material that includes an oxide or a nitride. For example, the fifth insulating layer 215 includes one or more of silicon oxide, silicon nitride, silicon oxynitride, aluminum oxide, titanium oxide, tantalum oxide, or hafnium oxide.

According to an embodiment, the power voltage line PL and the first connection electrode 267 include a relatively highly conductive material. The power voltage line PL and the first connection electrode 267 may have a single layer or a multi-layer structure that includes one or more of aluminum (Al), copper (Cu), or titanium (Ti). In an embodiment, the power voltage line PL and the first connection electrode 267 have a stacked structure of a triple layer of Ti/Al/Ti that are sequentially stacked. The first connection electrode 267 is connected to the sixth semiconductor layer AS6 through a contact hole. The connecting line 166 connects the first gate electrode G1 of the first transistor T1 (or the first electrode CE1 of the first capacitor Cst) with the fourth electrode of the second capacitor Cbt through contact holes in the second, third fourth and fifth insulating layer 212, 213, 214 and 215. The connecting line 166 is formed of a conductive material.

According to an embodiment, a sixth insulating layer 216, which is a planarization layer, is disposed on the fifth insulating layer 215 and covers the power voltage line PL, the first connection electrode 267 and the connecting line 166. The sixth insulating layer 216 includes an organic material such as benzocyclobutene (BCB), polyimide, or hexamethyldisiloxane (HMDSO). Alternatively, in other embodiments, the sixth insulating layer 216 includes an inorganic material. The sixth insulating layer 216 serves as a protective layer that covers the first transistor T1, the sixth transistor T6, and the fourth transistor T4. A top portion of the sixth insulating layer 216 is flat. The sixth insulating layer 216 may have a single layer or a multi-layer structure.

According to an embodiment, the data line DL and a second connection electrode 277 are disposed on the sixth insulating layer 216. The data line DL partially overlaps the power voltage line PL. The second connection electrode 277 is connected to the first connection electrode 267 through a contact hole formed in the sixth insulating layer 216. The data line DL and the second connection electrode 277 include a conductive material such as a metal or a conductive oxide. For example, the data line DL and the second connection electrode 277 may have a single layer or a multi-layer structure that includes one or more of aluminum (Al), copper (Cu), or titanium (Ti). In an embodiment, the data line DL and the second connection electrode 277 have a stacked structure of a triple layer of Ti/A/Ti that are sequentially stacked. A seventh insulating layer 217 is disposed on the sixth insulating layer 216 and that covers the data line DL and the second connection electrode 277.

According to an embodiment, the organic light-emitting diode OLED is disposed on the seventh insulating layer 217. The organic light-emitting diode OLED includes a pixel electrode 310, an opposite electrode 330, and an intermediate layer 320 interposed therebetween that includes an emission layer.

According to an embodiment, the pixel electrode 310 is connected to the second connection electrode 277 through a contact hole formed in the seventh insulating layer 217 and is connected to the sixth transistor T6 by the second connection electrode 277 and the first connection electrode 267.

According to an embodiment, an eighth insulating layer 218 that functions as a pixel-defining layer is disposed on the seventh insulating layer 217. The eighth insulating layer 218 defines an emission area of a pixel by including an opening 2180P that corresponds to each pixel. In addition, the eighth insulating layer 218 can prevent arcs, etc., from occurring at edges of the pixel electrode 310 by increasing a distance between the edges of the pixel electrode 310 and the opposite electrode 330 over the pixel electrode 310. The eighth insulating layer 218 includes an organic material that includes, for example, polyimide or HMDSO.

According to an embodiment, the pixel electrode 310 is disposed on the seventh insulating layer 217 and includes a conductive oxide, such as one or more of indium tin oxide (ITO), zinc oxide (IZO), zinc oxide (ZnO), indium oxide ($In_2O_3$), indium gallium oxide (IGO), or aluminum zinc oxide (AZO). In another embodiment, the pixel electrode 310 includes a reflective layer that includes one or more of silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 310 further includes a layer that includes ITO, IZO, ZnO, or $In_2O_3$ on or under the reflective layer.

According to an embodiment, the intermediate layer 320 of the organic light-emitting diode OLED includes an emission layer. The emission layer includes a polymer organic material or a low molecular weight organic material that emits light of a predetermined color. The emission layer is one of a red emission layer, a green emission layer, or a blue emission layer. Alternatively, in another embodiment, the emission layer has a multi-layered structure in which a red emission layer, a green emission layer, and a blue emission layer are stacked so as to emit white light, or has a single-layered structure that includes a red emission material, a green emission material, and a blue emission material. In an embodiment, the intermediate layer 320 includes one or more of a first functional layer under the emission layer or a second functional layer on the emission layer. The first functional layer and the second functional layer may each be a layer that is one body that covers a plurality of pixel electrodes 310 or be a layer that is patterned to correspond to each of the plurality of pixel electrodes 310.

According to an embodiment, the first functional layer has a single layer or a multi-layer structure. For example, when the first functional layer includes a polymer material, the first functional layer is a hole transport layer (HTL) which has a single-layered structure. The first functional layer includes poly-(3, 4)-ethylene-dihydroxy thiophene (PEDOT) or polyaniline (PANI). When the first functional layer includes a low molecular weight material, the first functional layer includes a hole injection layer (HIL) and a hole transport layer (HTL).

According to an embodiment, when the first functional layer and the emission layer include a polymer material, the second functional layer is formed to improve characteristics of the organic light-emitting diode OLED. The second functional layer may have a single layer or a multi-layer structure. The second functional layer includes one or more of an electron transport layer (ETL) or an electron injection layer (EIL). According to another embodiment, the second functional layer is omitted.

According to an embodiment, the opposite electrode 330 faces the pixel electrode 310 with the intermediate layer 320 interposed therebetween. The opposite electrode 330 includes a conductive material that has a low work function. For example, the opposite electrode 330 includes a (semi) transparent layer that includes one or more of Ag, Mg, Al, Pt, Pd, Au, Ni, Nd, Ir, Cr, lithium (Li), calcium (Ca), or an alloy thereof. Alternatively, in another embodiment, the opposite electrode 330 further includes a layer that includes ITO, IZO, ZnO, or $In_2O_3$ on or under the (semi) transparent layer that includes the above material. The opposite electrode 330 is disposed on the intermediate layer 320 and the eighth insulating layer 218. The opposite electrode 330 may be one body that covers the plurality of organic light-emitting diodes OLED in the display area DA and be a common electrode that faces the plurality of pixel electrodes 310.

According to an embodiment, a thin-film encapsulation layer or an encapsulation substrate is disposed on the organic light-emitting diode OLED to cover and protect the organic light-emitting diode OLED. The thin-film encapsulation layer covers the display area DA and extends out of the display area DA. The thin-film encapsulation layer includes an inorganic encapsulation layer that includes at least one inorganic material and an organic encapsulation layer that includes at least one organic material. In an embodiment, the thin-film encapsulation layer has a structure in which a first inorganic encapsulation layer, an organic encapsulation layer, and a second inorganic encapsulation layer are sequentially stacked. The encapsulation substrate faces the substrate 100 and is bonded to the substrate 100 by using a sealing member such as a sealant or a frit.

According to an embodiment, the fourth transistor T4 shown in FIG. 13 is formed by a process described with reference to FIGS. 1 to 9. The second gate electrode G42 of the fourth transistor T4 corresponds to the metal layer 105 of FIG. 9, the first gate electrode G41 of the fourth transistor T4 corresponds to the gate electrode 140 of FIG. 9, and insulating layers therebetween respectively correspond to the insulating layers described with reference to FIG. 9. A specific process of forming the fourth transistor T4 is the same as that described with reference to FIGS. 1 to 9.

Figure 14:
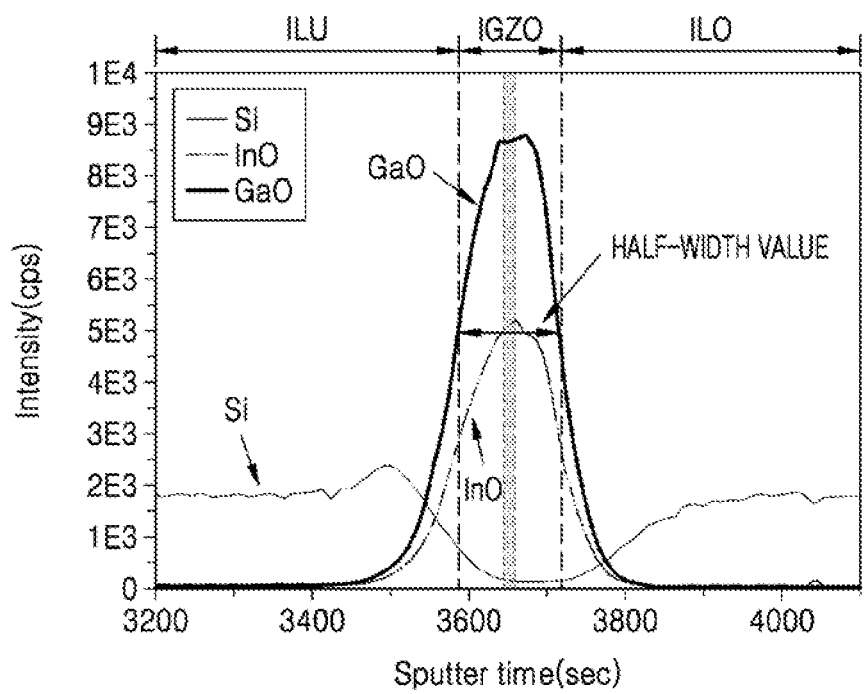
FIG. 14 is a graph of SIMS detection results for an oxide transistor of a display device according to an embodiment and of analysis results of some materials of the oxide transistor.

FIG. 14 is a graph of SIMS detection results for an oxide transistor included in a display device according to an embodiment and of analysis results of some materials of the oxide transistor.

As shown in FIG. 9 or 13, according to an embodiment, insulating layers are respectively formed on and under the oxide semiconductor layer of the oxide transistor. When SIMS is performed on a test piece that includes insulating layers respectively formed on and under the oxide semiconductor layer, the graph shown in FIG. 14 is obtained.

FIG. 14 is a graph of results of SIMS performed on a test piece in which insulating layers that include silicon are respectively formed on and under an oxide semiconductor layer that includes IGZO and shows the ionizing intensity of secondary ions as a function of sputtering time. Since SIMS is performed in a depth direction of the test piece, an interface of the test piece is determined by the ionizing intensity of the secondary ions as a function of sputtering time.

Referring to FIG. 14, according to an embodiment, a metal oxide of the oxide semiconductor layer, such as gallium oxide (GaO) or indium oxide (InO), shows a high intensity in a region that corresponds to the oxide semiconductor layer. In contrast, since the insulating layers respectively formed on and under the oxide semiconductor layer include silicon, a region in which the strength of silicon is high is a region that corresponds to the insulating layers.

According to an embodiment, since SIMS is performed on a test piece that includes an oxide semiconductor layer and insulating layers formed on and under the oxide semiconductor, a region that corresponds to the oxide semiconductor layer corresponds to a half-width value of GaO on the graph shown in FIG. 14, and two opposite sides around the relevant region (IGZO of FIG. 14) respectively correspond to an insulating layer ILU disposed over the oxide semiconductor layer and an insulating layer ILO disposed under the oxide semiconductor layer.

In FIG. 14, although the region that corresponds to a half-width value of GaO corresponds to the oxide semiconductor layer, a region that corresponds to a half-width value of InO corresponds to the oxide semiconductor layer in another method.

Figure 15:
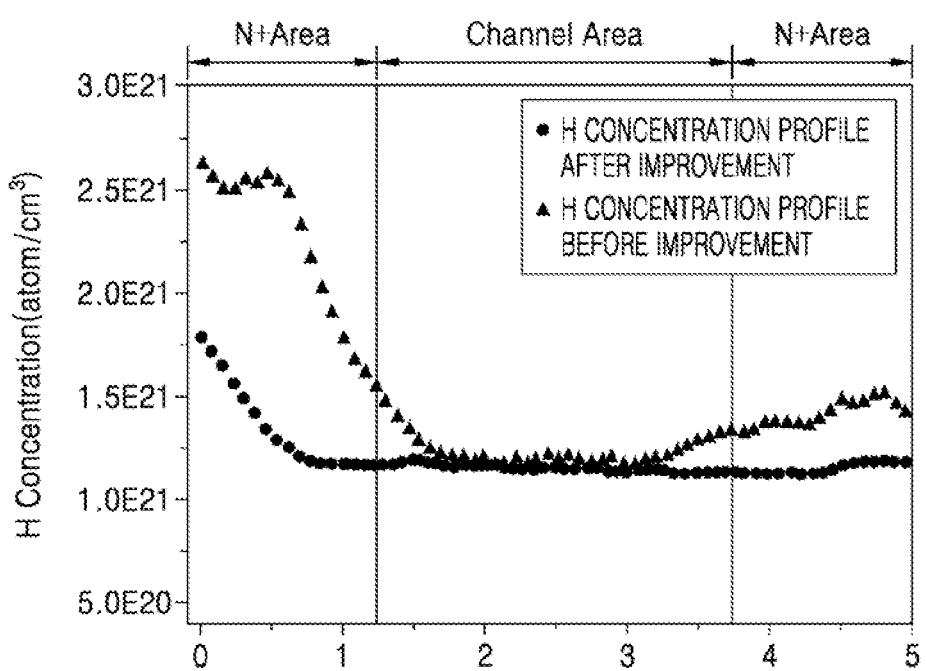
FIG. 15 is a graph that shows the hydrogen concentration in an oxide semiconductor layer of an oxide transistor of a display device according to an embodiment.

FIG. 15 is a graph that shows hydrogen concentration in an oxide semiconductor layer of an oxide transistor of a display device according to an embodiment. The "H CONCENTRATION PROFILE AFTER IMPROVEMENT" of FIG. 15 corresponds to an embodiment of the present inventive concept, and the "H CONCENTRATION PROFILE BEFORE IMPROVEMENT" of FIG. 15 corresponds a comparative example.

An embodiment of FIG. 15 is formed through substantially the same processes as those described with reference to FIGS. 1 to 9, and differs from FIGS. 1 to 9 in that a contact hole that exposes one of the first and second conductive regions is formed. The oxide semiconductor layer of an embodiment formed through the above process has been manufactured so as to include IGZO, and a specific shape thereof is the same as that of the fourth transistor described with reference to FIG. 13.

Referring to FIG. 15, according to an embodiment, it is shown that the hydrogen concentration of the oxide semiconductor layer that includes IGZO manufactured according to an embodiment has a relatively constant value in a channel region. FIG. 15 shows that the hydrogen concentration in the channel region is in a range from about $1\times10^{21}$ atom/cm$^3$ to about $2\times10^{21}$ atom/cm$^3$. Specifically, the graph of FIG. 15 shows a range from about $1.5\times10^{21}$ atom/cm$^3$ to about $2\times10^{21}$ atom/cm$^3$. It is known that an HC value according to Equation (1) is less than 30 [%] in the channel region. Specifically, the graph of FIG. 15 shows that (Max−Min)/Avg×100<15 [%].

As a comparative example, referring to the "H CONCENTRATION PROFILE BEFORE IMPROVEMENT" of FIG. 15, when a process different from that of an embodiment of the present disclosure, such as when the process described with reference to FIG. 2 is omitted and the third insulating layer is formed by using a layer-forming gas that includes ammonia during the process of forming the top insulating layer 150 described with reference to FIG. 6, a difference in hydrogen concentration in the channel region is (Max−Min)/Avg×100>30 [%] and since a valid channel length of the channel region is reduced in an oxide semiconductor layer according to a comparative example, a sufficient specification for driving a display device may be secured.

According to embodiments, a valid channel length in the channel region of an oxide semiconductor layer is sufficiently secured, and thus an operating characteristic of a pixel circuit electrically connected to a light-emitting diode of a display device is improved and thus a high-quality image may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
   a substrate;
   a first insulating layer disposed on the substrate and that includes an inorganic insulating material;
   an oxide semiconductor layer disposed on the first insulating layer;
   a second insulating layer disposed on the oxide semiconductor layer and that includes an inorganic insulating material;
   a gate electrode disposed on the second insulating layer; and
   a third insulating layer disposed on the gate electrode and that includes an inorganic insulating material,
   wherein the oxide semiconductor layer includes a first conductive region, a second conductive region, and a channel region located between the first conductive region and the second conductive region, and
   a hydrogen concentration of the oxide semiconductor layer is within a range from about $5\times10^{20}$ atom/cm$^3$ to about $2\times10^{21}$ atom/cm$^3$, and
   a value in the channel region of the oxide semiconductor layer of HC according to Equation (1) is less than 30%:

$$HC[\%] = (Max-Min)/Avg \times 100 \qquad \text{Equation (1)},$$

wherein Max represents a maximum hydrogen concentration value detected from a plurality of points within the channel region, Min represents a minimum hydrogen concentration value detected from a plurality of points within the channel region, and Avg represents an average hydrogen concentration value detected from a plurality of points within the channel region,
   wherein the hydrogen concentration is measured in a valid region of the channel region that is separated from edges of the channel region by about 0.15% times a length of the channel region L and by about 0.15% times a width of the channel region.

2. The display device of claim 1, wherein a hydrogen concentration of the channel region is within a range from about $1\times10^{21}$ atom/cm$^3$ to about $2\times10^{21}$ atom/cm$^3$.

3. The display device of claim 1, wherein the second insulating layer includes a silicon oxide layer.

4. The display device of claim 1, wherein at least one of the first insulating layer or the third insulating layer includes a silicon oxide layer or a silicon nitride layer.

5. The display device of claim 1, further comprising:
   a metal layer interposed between the substrate and the first insulating layer.

6. The display device of claim 1, wherein the oxide semiconductor layer contains fluorine, and a concentration of the fluorine of the oxide semiconductor layer is in a range from about $5\times10^{17}$ atom/cm$^3$ to about $5\times10^{18}$ atom cm$^3$.

7. The display device of claim 5, wherein the metal layer includes a bottom gate electrode.

8. A display device, comprising:
   a substrate;
   a first transistor and a second transistor each disposed on the substrate, wherein one of the first transistor or the second transistor includes:
      an oxide semiconductor layer that includes a channel region,
      a first conductive region, and
      a second conductive region,
      wherein the first conductive region and the second conductive region are located on two opposite sides of the channel region, respectively;

a first insulating layer interposed between the substrate and the oxide semiconductor layer, a gate electrode that overlaps the channel region of the oxide semiconductor layer;

a second insulating layer interposed between the oxide semiconductor layer and the gate electrode; and a third insulating layer disposed on the second insulating layer and that covers the gate electrode, wherein a hydrogen concentration of the oxide semiconductor layer is within a range from about $5 \times 10^{20}$ atom/cm$^3$ to about $2 \times 10^{21}$ atom/cm$^3$, and a value in the channel region of the oxide semiconductor layer of HC according to Equation (1) is less than 30%:

$$HC[\%] = (Max-Min)/Avg \times 100 \qquad \text{Equation (1),}$$

wherein Max represents a maximum hydrogen concentration value detected from a plurality of points within the channel region, Min represents a minimum hydrogen concentration value detected from a plurality of points within the channel region, and Avg represents an average hydrogen concentration value detected from a plurality of points within the channel region, wherein the hydrogen concentration is measured in a valid region of the channel region that is separated from edges of the channel region by about 0.15% times a length of the channel region L and by about 0.15% times a width of the channel region.

9. The display device of claim 8, wherein a hydrogen concentration of the channel region is within a range from about $1 \times 10^{21}$ atom/cm$^3$ to about $2 \times 10^{21}$ atom/cm$^3$.

10. The display device of claim 8, wherein the second insulating layer includes a silicon oxide layer, and at least one of the first insulating layer or the third insulating layer includes a silicon oxide layer or a silicon nitride layer.

11. The display device of claim 8, flintier comprising a bottom metal layer interposed between the substrate and the first insulating layer.

12. The display device of claim 11, wherein the bottom metal layer has a same voltage level as that of the gate electrode.

13. The display device of claim 8, wherein the other of the first transistor and the second transistor includes a silicon transistor.

\* \* \* \* \*